US006939801B2

(12) United States Patent
Chung et al.

(10) Patent No.: US 6,939,801 B2
(45) Date of Patent: Sep. 6, 2005

(54) SELECTIVE DEPOSITION OF A BARRIER LAYER ON A DIELECTRIC MATERIAL

(75) Inventors: Hua Chung, San Jose, CA (US); Ling Chen, Sunnyvale, CA (US); Vincent W. Ku, San Jose, CA (US); Michael X. Yang, Palo Alto, CA (US); Gongda Yao, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 174 days.

(21) Appl. No.: 10/319,788

(22) Filed: Dec. 13, 2002

(65) Prior Publication Data

US 2003/0224578 A1 Dec. 4, 2003

Related U.S. Application Data

(60) Provisional application No. 60/342,307, filed on Dec. 21, 2001.

(51) Int. Cl.[7] .............................................. H01L 21/44
(52) U.S. Cl. ....................... 438/656; 438/652; 438/642; 438/597
(58) Field of Search ................................ 438/597, 642, 438/643, 652, 653, 656

(56) References Cited

U.S. PATENT DOCUMENTS

| | | | |
|---|---|---|---|
| 4,389,973 A | 6/1983 | Suntola et al. | 118/725 |
| 4,413,022 A | 11/1983 | Suntola et al. | 427/255.2 |
| 5,916,365 A | 6/1999 | Sherman | 117/92 |
| 5,923,056 A | 7/1999 | Lee et al. | 257/192 |
| 6,015,917 A | 1/2000 | Bhandari et al. | 556/12 |
| 6,084,302 A | 7/2000 | Sandhu | 257/751 |
| 6,124,158 A | 9/2000 | Dautartas et al. | 438/216 |
| 6,144,060 A | 11/2000 | Park et al. | 257/310 |
| 6,174,809 B1 | 1/2001 | Kang et al. | 438/682 |

(Continued)

FOREIGN PATENT DOCUMENTS

| | | | |
|---|---|---|---|
| EP | 1 167 569 | 1/2002 | C23C/16/455 |
| GB | 2 355 727 | 5/2001 | C23C/16/44 |
| JP | 2001111000 | 4/2001 | H01L/27/105 |
| JP | 2001172767 | 6/2001 | C23C/16/40 |

(Continued)

OTHER PUBLICATIONS

Kukli, et al., "Tailoring the Dielectric Properties of $HfO_2$–$Ta_2$–$O_5$ Nanolaminates," Applied Physics Letters, vol. 68, No. 26, Jun. 24, 1996; p. 3737–9.

Kukli, et al. "Atomic Layer Epitaxy Growth of Tantalum Oxide Thin Films from $Ta(OC_2H_5)_5$ and $H_2O$," Journal of the Electrochemical Society, vol. 142, No. 5, May 1995; p. 1670–5.

Kukli, et al., "*In situ* Study of Atomic Layer Epitaxy Growth of Tantalum Oxide Thin Films From $Ta(OC_2H_5)_5$ and $H_2O$," Applied Surface Science, vol. 112, Mar. 1997, p. 236–42.

Kukli, et al., "Properties of $Ta_2O_5$–Based Dielectric Nanolaminates Deposited by Atomic Layer Epitaxy," Journal of the Electrochemical Society, vol. 144, No. 1, Jan. 1997; p. 300–6.

(Continued)

*Primary Examiner*—Brad Smith
(74) *Attorney, Agent, or Firm*—Moser, Patterson & Sheridan LLP

(57) ABSTRACT

A method to selectively deposit a barrier layer on dielectric material that surrounds one or more metal interconnects on a substrate is disclosed. The barrier layer is selectively deposited on the metal film using a cyclical deposition process including a predetermined number of deposition cycles followed by a purge step. Each deposition cycle comprises alternately adsorbing a refractory metal-containing precursor and a reducing gas on the dielectric material formed on the substrate in a process chamber.

43 Claims, 9 Drawing Sheets

U.S. PATENT DOCUMENTS

| | | | |
|---|---|---|---|
| 6,197,683 B1 | 3/2001 | Kang et al. | 438/643 |
| 6,200,893 B1 | 3/2001 | Sneh | 438/685 |
| 6,203,613 B1 | 3/2001 | Gates et al. | 117/104 |
| 6,207,487 B1 | 3/2001 | Kim et al. | 438/238 |
| 6,270,572 B1 | 8/2001 | Kim et al. | 117/93 |
| 6,284,646 B1 | 9/2001 | Leem | 438/629 |
| 6,287,965 B1 | 9/2001 | Kang et al. | 438/648 |
| 6,305,314 B1 | 10/2001 | Sneh et al. | 118/723 |
| 6,342,277 B1 | 1/2002 | Sherman | 427/562 |
| 6,348,376 B2 | 2/2002 | Lim et al. | 438/253 |
| 6,358,829 B2 | 3/2002 | Yoon et al. | 438/597 |
| 6,372,598 B2 | 4/2002 | Kang et al. | 438/399 |
| 6,379,748 B1 | 4/2002 | Bhandari et al. | 427/255.394 |
| 6,391,785 B1 | 5/2002 | Satta et al. | 437/704 |
| 6,399,491 B2 | 6/2002 | Jeon et al. | 438/680 |
| 6,416,577 B1 | 7/2002 | Suntoloa et al. | 117/88 |
| 6,416,822 B1 | 7/2002 | Chiang et al. | 427/561 |
| 6,428,859 B1 | 8/2002 | Chiang et al. | 427/457 |
| 6,451,119 B2 | 9/2002 | Sneh et al. | 118/715 |
| 6,451,695 B2 | 9/2002 | Sneh | 438/685 |
| 6,468,924 B2 | 10/2002 | Lee et al. | 438/763 |
| 6,475,276 B1 | 11/2002 | Elers et al. | 117/84 |
| 6,475,910 B1 | 11/2002 | Sneh | 438/685 |
| 6,482,262 B1 | 11/2002 | Elers et al. | 117/84 |
| 6,482,733 B2 | 11/2002 | Raaijmakers et al. | 438/633 |
| 6,511,539 B1 | 1/2003 | Raaijmakers | 117/102 |
| 6,632,279 B1 | 10/2003 | Ritala et al. | |
| 2001/0000866 A1 | 5/2001 | Sneh et al. | 118/723 |
| 2001/0002280 A1 | 5/2001 | Sneh | 427/255.28 |
| 2001/0009695 A1 | 7/2001 | Saanila et al. | 427/255.39 |
| 2001/0024387 A1 | 9/2001 | Raaijmakers et al. | 365/200 |
| 2001/0025979 A1 | 10/2001 | Kim et al. | 257/315 |
| 2001/0028924 A1 | 10/2001 | Sherman | 427/255.28 |
| 2001/0034123 A1 | 10/2001 | Jeon et al. | 438/643 |
| 2001/0041250 A1 | 11/2001 | Werkhoven et al. | 428/212 |
| 2001/0054730 A1 | 12/2001 | Kim et al. | 257/301 |
| 2001/0054769 A1 | 12/2001 | Raaijmakers et al. | 257/758 |
| 2002/0000598 A1 | 1/2002 | Kang et al. | 257/301 |
| 2002/0007790 A1 | 1/2002 | Park | 118/715 |
| 2002/0020869 A1 | 2/2002 | Park et al. | 257/306 |
| 2002/0021544 A1 | 2/2002 | Cho et al. | 361/200 |
| 2002/0031618 A1 | 3/2002 | Sherman | 427/569 |
| 2002/0048635 A1 | 4/2002 | Kim et al. | 427/331 |
| 2002/0052097 A1 | 5/2002 | Park | 438/507 |
| 2002/0068458 A1 | 6/2002 | Chiang et al. | 438/694 |
| 2002/0073924 A1 | 6/2002 | Chiang et al. | 118/723 R |
| 2002/0076481 A1 | 6/2002 | Chiang et al. | 427/8 |
| 2002/0076507 A1 | 6/2002 | Chiang et al. | 427/569 |
| 2002/0076508 A1 | 6/2002 | Chiang et al. | 427/569 |
| 2002/0076837 A1 | 6/2002 | Hujanen et al. | 438/3 |
| 2002/0094689 A1 | 7/2002 | Park | 438/694 |
| 2002/0098627 A1 | 7/2002 | Pomarede et al. | 438/149 |
| 2002/0104481 A1 | 8/2002 | Chiang et al. | 118/723 |
| 2002/0106536 A1 | 8/2002 | Lee et al. | 428/702 |
| 2002/0144655 A1 | 10/2002 | Chiang et al. | 118/715 |
| 2002/0144657 A1 | 10/2002 | Chiang et al. | 118/723 E |
| 2002/0146511 A1 | 10/2002 | Chiang et al | 427/248.1 |
| 2002/0155722 A1 | 10/2002 | Satta et al. | 438/704 |
| 2002/0162506 A1 | 11/2002 | Sneh et al. | 118/715 |
| 2002/0164421 A1 | 11/2002 | Chiang et al. | 427/248.1 |
| 2002/0164423 A1 | 11/2002 | Chiang et al. | 427/255.28 |
| 2002/0177282 A1 | 11/2002 | Song | 438/300 |
| 2002/0182320 A1 | 12/2002 | Leskela et al. | 427/250 |
| 2002/0187256 A1 | 12/2002 | Elers et al. | 427/99 |
| 2002/0195683 A1 | 12/2002 | Lee et al. | |
| 2002/0197402 A1 | 12/2002 | Chiang et al. | 427/255.39 |
| 2003/0013320 A1 | 1/2003 | Kim et al. | 438/778 |
| 2003/0031807 A1 | 2/2003 | Elers et al. | 427/569 |
| 2003/0042630 A1 | 3/2003 | Babcoke et al. | 261/121.1 |
| 2003/0049942 A1 | 3/2003 | Haukka et al. | 438/778 |
| 2003/0072975 A1 | 4/2003 | Shero et al. | 428/704 |
| 2003/0082296 A1 | 5/2003 | Elers et al. | 427/96 |
| 2003/0124262 A1 * | 7/2003 | Chen et al. | 427/404 |

FOREIGN PATENT DOCUMENTS

| | | | |
|---|---|---|---|
| JP | 20011172767 | 6/2001 | |
| WO | WO 99/29924 | 6/1999 | C23C/16/04 |
| WO | WO 99/65064 | 12/1999 | H01L/21/00 |
| WO | WO 00/16377 | 3/2000 | |
| WO | WO 00/054320 | 9/2000 | H01L/21/44 |
| WO | WO 01/15220 | 3/2001 | H01L/21/768 |
| WO | WO 01/17692 | 3/2001 | B05C/11/00 |
| WO | WO 01/27346 | 4/2001 | C23C/16/44 |
| WO | WO 01/27347 | 4/2001 | C23C/16/44 |
| WO | WO 01/29280 | 4/2001 | C23C/16/32 |
| WO | WO 01/29891 | 4/2001 | H01L/21/768 |
| WO | WO 01/29893 | 4/2001 | H01L/21/768 |
| WO | WO 01/36702 | 5/2001 | C23C/16/00 |
| WO | WO 01/66832 | 9/2001 | C30B/25/14 |
| WO | WO 02/08485 | 1/2002 | C23C/16/00 |
| WO | WO 02/43115 | 5/2002 | |
| WO | WO 02/45167 | 6/2002 | H01L/27/00 |

OTHER PUBLICATIONS

Kukli, et al., "Properties of {Nb$_{1-x}$Ta$_x$}$_2$O$_5$ Solid Solutions and {Nb$_{1-x}$Ta$_x$}$_2$O$_5$–ZrO$_2$ Nanolaminates Grown by Atomic Layer Epitaxy," 1997; p. 785–93.

Ritala, M., et al., "Chemical Vapor Deposition," Jan. 1999, p. 6–9.

Rossnagel, et al., "Plasma–enhanced Atomic Layer Deposition of Ta and Ti for Interconnect Diffusion Barriers," J. Vacuum Sci. & Tech. B., vol. 18, No. 4 (Jul. 2000), pp. 2016–2020.

Niinisto, et al. "Synthesis of Oxide Thin Films and Overlayers by Atomic Layer Epitaxy for Advanced Applications," Materials Science and Engineering B41 (1996) 23–29.

Eisenbraum, et al. "Atomic Layer Deposition (ALD) of Tantalum–based materials for zero thickness copper barrier applications," Proceedings of the IEEE 2001 International Interconnect Technology Conference (Cat. No. 01EX461) 2001.

Clark–Phelps, et al. "Engineered Tantalum Aluminate and Hafnium Aluminate ALD Films for Ultrathin Dielectric Films with Improved Electrical and Thermal Properties," Mat. Res. Soc. Symp. Proc. vol. 670 (2001).

* cited by examiner

SELECTIVE DEPOSITION OF A BARRIER LAYER ON A DIELECTRIC MATERIAL

CROSS-REFERENCE TO RELATED APPLICATIONS

This application claims benefit of U.S. provisional patent application Ser. No. 60/342,307, filed on Dec. 21, 2001, which is incorporated by reference in its entirety.

BACKGROUND OF THE INVENTION

1. Field of the Invention

Embodiments of the present invention relate generally to a method of barrier layer formation.

2. Description of the Related Art

Integrated circuits have evolved into complex devices that can include millions of components (e.g., transistors, capacitors and resistors) on a single chip. The evolution of chip designs continually requires faster circuitry and greater circuit densities. The demand for greater circuit densities necessitates a reduction in the dimensions of the integrated circuit components.

As the dimensions of the integrated circuit components are reduced (e.g., sub-micron dimensions), the materials used to fabricate such components contribute to the electrical performance thereof. For example, low resistivity metal interconnects (e.g., aluminum (Al) and copper (Cu)) provide conductive paths between the components on integrated circuits.

Referring to FIG. 1, the metal interconnects 2 are typically electrically isolated from each other by a bulk insulating material 4. When the distance between adjacent metal interconnects 2 and/or the thickness of the bulk insulating material 4 has sub-micron dimensions, capacitive coupling occurs between such interconnects 2. Capacitive coupling between adjacent metal interconnects 2 may cause cross-talk and/or resistance-capacitance (RC) delay, which degrades the overall performance of the integrated circuit.

In order to minimize capacitive coupling between adjacent metal interconnects, low dielectric constant bulk insulating materials 4 (e.g., dielectric constants less than about 3.5) are used. Examples of low dielectric constant bulk insulating materials include silicon dioxide ($SiO_2$), silicate glass and organosilicate glass, among others.

In addition, a barrier layer 6 often separates the metal interconnects 2 from the bulk insulating material 4. The barrier layer 6 minimizes the diffusion of the metal from the metal interconnects 2 into the bulk insulating material 4. Diffusion of the metal from the metal interconnects 2 into the bulk insulating material 4 is undesirable because such diffusion can affect the electrical performance of the integrated circuit (e.g., cross-talk and/or RC delay) or render it inoperable. Examples of barrier materials include refractory metals such as titanium (Ti), tantalum (Ta) and tungsten (W), among others and refractory metal nitrides such as titanium nitride (TiN), tantalum.nitride (TaN) and tungsten nitride (WN), among others.

Barrier materials are typically deposited using physical vapor deposition (PVD) techniques and/or chemical vapor deposition (CVD) techniques. Such techniques deposit the barrier material on all surfaces of the interconnect structure including the metal interconnect 2 and the insulating material 4. However, when the dimensions of the interconnect structures are sub-quarter micron, deposition of barrier material on the metal interconnects 2 tends to increase the resistivity of the interconnect structure which may degrade the electrical properties of the device.

Thus, a need exists for a method to selectively deposit a barrier layer on a dielectric material.

SUMMARY OF THE INVENTION

A method to selectively deposit a barrier layer on dielectric material that surrounds one or more metal interconnects on a substrate is described. The barrier layer may comprise a refractory metal nitride such as, for example, tantalum nitride (TaN). The barrier layer is selectively deposited on the dielectric layer using a cyclical deposition process including a predetermined number of deposition cycles followed by a purge step.

In the cyclical deposition process, each deposition cycle comprises alternately adsorbing a refractory metal-containing precursor and a reducing gas on the dielectric material formed on the substrate in a process chamber. The refractory metal-containing precursor and the reducing gas react to form the barrier layer on the dielectric material. After a predetermined number of deposition cycles are completed, the process chamber is purged of both the refractory metal-containing precursor and the reducing gas. This deposition sequence of performing a predetermined number of deposition cycles followed by a process chamber purge may be repeated until a desired barrier layer thickness is achieved.

The predetermined number of deposition cycles is selected to take advantage of differences in the number of deposition cycles needed to start depositing the barrier material on different types of material layers. Thus, the predetermined number of deposition cycles is advantageously selected to start deposition of the barrier material on the dielectric material but is less than the number of deposition cycles needed to start deposition of such barrier material on the metal interconnects. As such, barrier material is only deposited on the dielectric material without being deposited on any metal interconnects.

The selective deposition of the barrier layer is compatible with integrated circuit fabrication processes. In one integrated circuit fabrication process, the barrier layer is used in a damascene structure. For such an embodiment, a preferred process sequence includes providing a substrate with one or more dielectric material layers thereon having vias defined therethrough to metal features. A barrier layer is selectively deposited on the dielectric material using a cyclic deposition process in which a predetermined number of deposition cycles, each comprising alternately adsorbing a refractory metal-containing precursor and a reducing gas on the dielectric material, is followed by a process chamber purge step. The cyclical deposition process is repeated until a desired thickness for the barrier layer is achieved. After the barrier layer is selectively deposited on the dielectric material, the damascene structure is completed by filling the vias with a conductive material.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
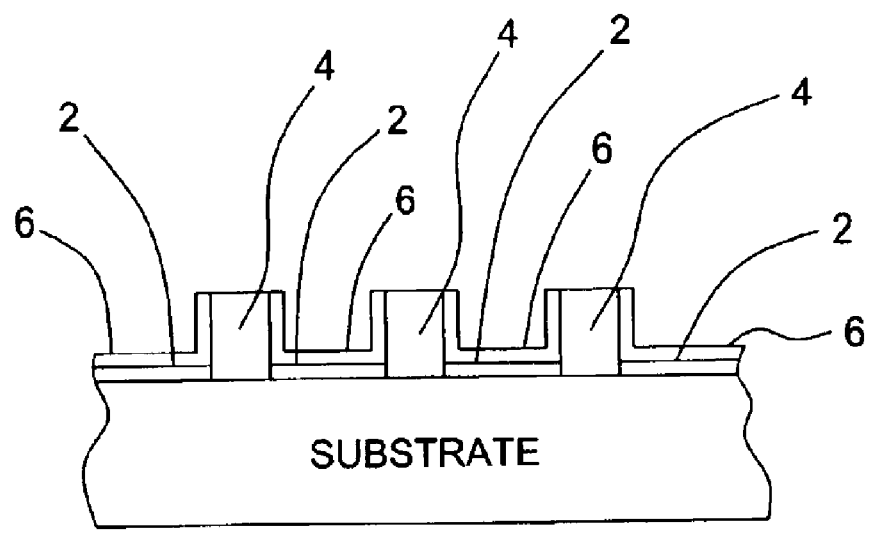
FIG. 1 is a cross-sectional view of a metal interconnect structure including a barrier layer formed on both metal interconnects and bulk insulating material.
Figure 2:
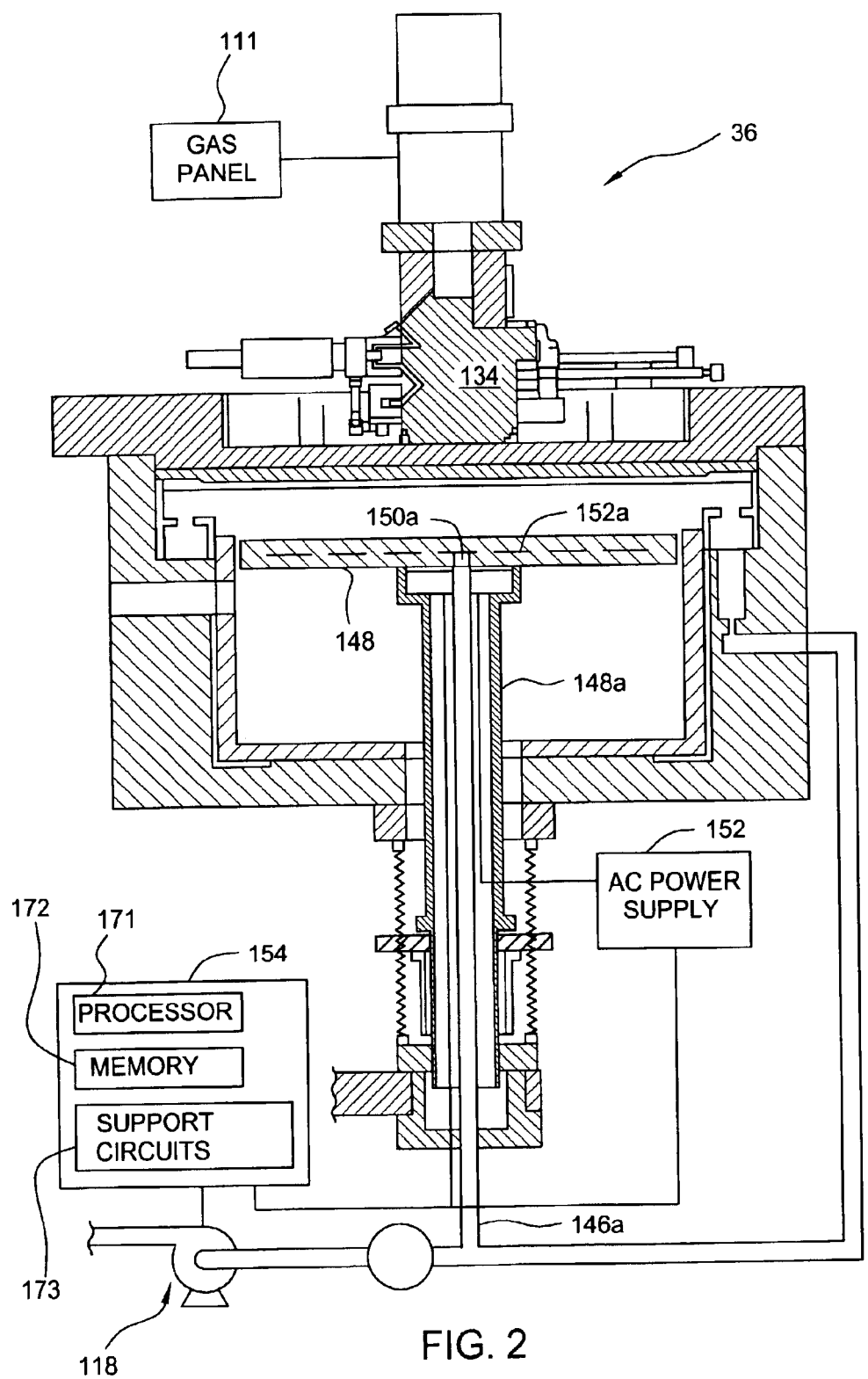
FIG. 2 depicts a schematic cross-sectional view of a process chamber that can be used to perform a cyclical deposition process as described herein.

FIG. 2 depicts a schematic cross-sectional view of a process chamber 36 that can be used to perform a cyclical deposition process in accordance with embodiments described herein. The process chamber 36 generally houses a wafer support pedestal 148, which is used to support a substrate (not shown). The wafer support pedestal 148 is movable in a vertical direction inside the process chamber 36 using a displacement mechanism 148a.

Depending on the specific process, the substrate can be heated to some desired temperature prior to or during deposition. For example, the wafer support pedestal 148 may be heated using an embedded heater element 152a. The wafer support pedestal 148 may be resistively heated by applying an electric current from an AC power supply 152 to the heater element 152a. The substrate (not shown) is, in turn, heated by the pedestal 148. Alternatively, the wafer support pedestal 148 may be heated using radiant heaters, such as, for example, lamps (not shown).

A temperature sensor 150a, such as a thermocouple, is also embedded in the wafer support pedestal 148 to monitor the temperature of the pedestal 148 in a conventional manner. The measured temperature is used in a feedback loop to control the AC power supply 152 for heating element 152a, such that the substrate temperature can be maintained or controlled at a desired temperature which is suitable for a particular process application.

A vacuum pump 118 is used to evacuate the process chamber 36 and to maintain the pressure inside the process chamber 36. A gas manifold 134, through which process gases are introduced into the process chamber 36, is located above the wafer support pedestal 148. The gas manifold 134 is connected to a gas panel 111, which controls and supplies various process gases to the process chamber 36.

Proper control and regulation of the gas flows to the gas manifold 134 are performed by mass flow controllers (not shown) and a microprocessor controller 154. The gas manifold 134 allows process gases to be introduced and uniformly distributed in the process chamber 36. Additionally, the gas manifold 134 may optionally be heated to prevent condensation of any reactive gases within the manifold.

The gas manifold 134 includes a plurality of electronic control valves (not shown). The electronic control valves as used herein refer to any control valve capable of providing rapid and precise gas flow to the process chamber 36 with valve open and close cycles of less than about 1–2 seconds, and more preferably less than about 0.1 second.

The microprocessor controller 154 may be one of any form of general purpose computer processor (CPU) 171 that can be used in an industrial setting for controlling various chambers and sub-processors. The computer may use any suitable memory 172, such a random access memory, read only memory, floppy disk drive, hard disk, or any other form of digital storage, local or remote. Various support circuits 173 may be coupled to the CPU for supporting the processor in a conventional manner. Software routines as required may be stored in the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or combination of software or hardware.

Selective Barrier Layer Deposition on a Dielectric Layer

A method to selectively deposit a barrier layer on a dielectric layer formed on a substrate is described. The barrier layer may comprise a refractory metal nitride, such as, for example, tantalum nitride (TaN), among others. The barrier layer is selectively deposited on the dielectric layer using a cyclical deposition process including a predetermined number of deposition cycles followed by a purge step.

In the cyclical deposition process, each deposition cycle comprises alternately adsorbing a refractory metal-containing precursor and a reducing gas on the dielectric layer formed on the substrate in a process chamber. The refractory metal-containing precursor and the reducing gas react to form the barrier layer on the dielectric layer. After a predetermined number of deposition cycles are completed, the process chamber is purged of both the refractory metal-containing precursor and the reducing gas. This deposition sequence of performing a predetermined number of deposition cycles followed by a process chamber purge may be repeated until a desired barrier layer thickness is achieved.

The predetermined number of deposition cycles is selected to take advantage of differences in the number of deposition cycles needed to start depositing the barrier material on different types of material layers. Thus, the predetermined number of deposition cycles is advantageously selected to start deposition of the barrier material on the dielectric layer, but is less than the number of deposition cycles needed to start deposition of such barrier material on metal films adjacent thereto.

Figure 3:
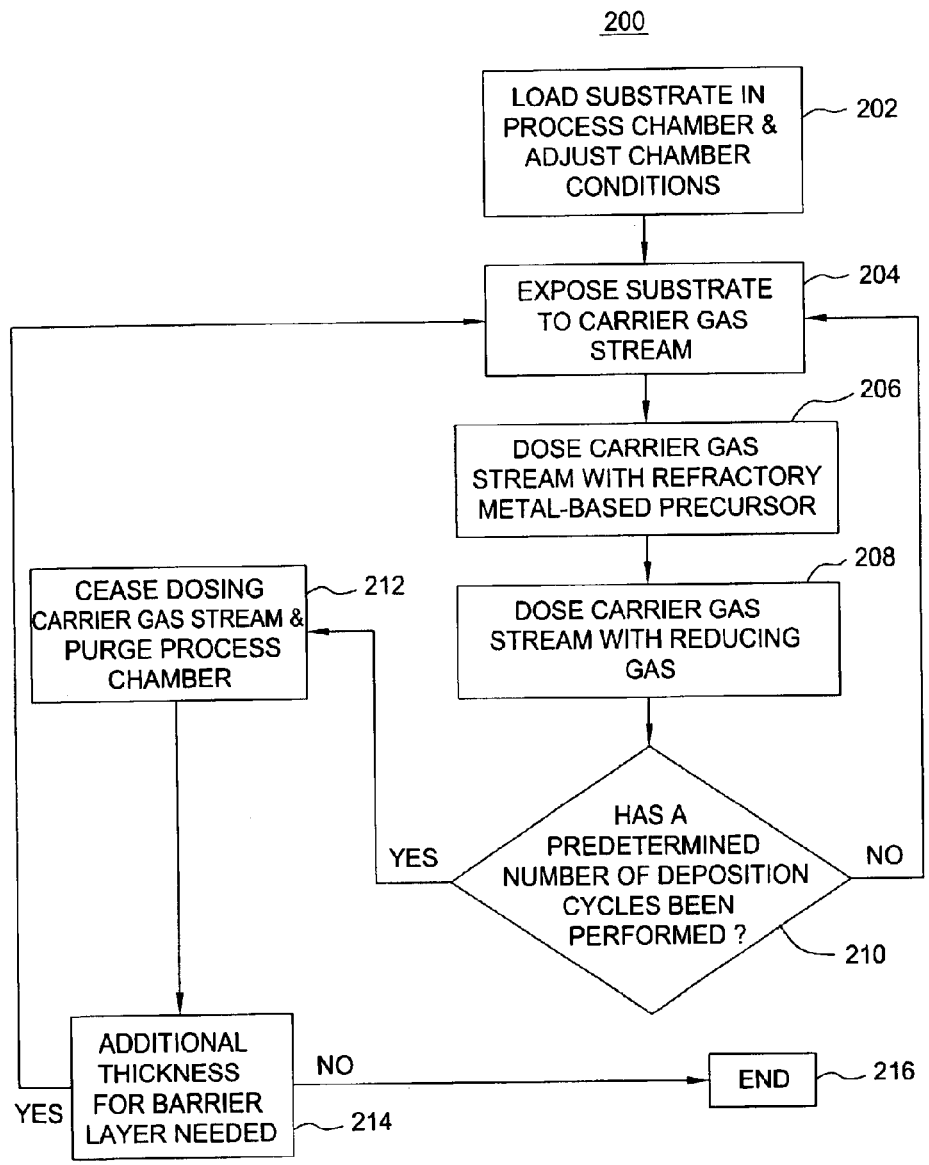
FIG. 3 illustrates a process sequence incorporating selective deposition of a barrier layer on a dielectric material using a cyclical deposition process according to one embodiment described herein.

FIG. 3 illustrates a process sequence 200 according to the present invention detailing the various steps used for the selective deposition of a barrier layer on a dielectric layer utilizing a constant carrier gas flow. These steps may be performed in a process chamber similar to that described above with reference to FIG. 2. As indicated in step 202, a substrate is introduced into a process chamber. The substrate may be, for example, a silicon substrate having thereon one or more copper features surrounded by a dielectric material layer. The process chamber conditions such as, for example, the temperature and pressure are adjusted to enhance the selective deposition of the barrier material on the dielectric material layer and impede deposition of the barrier material on the metal film.

In one embodiment where a constant carrier gas flow is desired, a carrier gas stream is established within the process chamber, as indicated in step 204. Carrier gases may be selected so as to also act as a purge gas for removal of volatile reactants and/or by-products from the process chamber. Carrier gases such as, for example, helium (He), argon (Ar), nitrogen ($N_2$) and hydrogen ($H_2$), as well as combinations thereof, among others, may be used.

Referring to step 206, after the carrier gas stream is established within the process chamber, a pulse of the refractory metal-containing precursor is added to the carrier gas stream. The term pulse as used herein refers to a dose of material injected into the process chamber or into the carrier gas stream. The pulse may comprise one injection of the refractory metal-containing precursor or several short, sequential injections. The pulse of the refractory metal-containing precursor lasts for a predetermined time interval. When the barrier layer comprises tantalum nitride (TaN), suitable tantalum-containing precursors may include, for example, pentakis(dimethylamido) tantalum (PDMAT), pentakis(diethylamido) tantalum (PDEAT), pentakis (ethylmethylamido) tantalum (PEMAT), t-butylamino tris (methylethylamido) tantalum (TBTMET), t-butylamino tris (dimethylamido) tantalum (TBTDMT), bis (cyclopentadienyl) tantalum trihydride, bis (methylcyclopentadienyl) tantalum trihydride and t-butylamino tris(diethylamido) tantalum (TBTDET), among others.

The time interval for the pulse of the refractory metal-containing precursor is variable depending on a number of factors such as, for example, the volume capacity of the process chamber employed, the vacuum system coupled thereto and the volatility/reactivity of the reactants used. In general, the process conditions are advantageously selected so that at least a monolayer of the refractory metal-containing precursor may be adsorbed on the dielectric layer, without adsorption of the refractory metal-containing precursor on adjacent metal films. Thereafter, excess refractory metal-containing precursor remaining in the process chamber may be removed therefrom by the constant carrier gas stream in combination with the vacuum system.

In step 208, after excess refractory metal-containing precursor has been sufficiently removed from the process chamber by the carrier gas stream to prevent co-reaction or particle formation with a subsequently provided process gas, a pulse of a reducing gas is added to the carrier gas stream. When the barrier layer comprises tantalum nitride (TaN) suitable reducing gases include, for example, ammonia ($NH_3$), hydrazine ($N_2H_4$), methyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azoisobutane (($CH_3$)$_6C_2N_2$) and ethylazide ($C_2H_5N_3$), among others.

The pulse of the reducing gas also lasts for a predetermined time interval. In general, the time interval for the pulse of the reducing gas should be long enough to provide a sufficient amount of the reducing gas for reaction with the refractory metal-containing precursor that is already adsorbed on the dielectric layer. Thereafter, excess reducing gas is flushed from the process chamber by the carrier gas stream in combination with the vacuum system.

Steps 204 through 208 comprise one embodiment of a deposition cycle for the barrier layer. For such an embodiment, a constant flow of the carrier gas is provided to the process chamber modulated by alternating periods of pulsing and non-pulsing where the periods of pulsing alternate between the refractory metal-containing precursor and the reducing gas along with the carrier gas stream, while the periods of non-pulsing include only the carrier gas stream.

The time interval for each of the pulses of the refractory metal-containing precursor and the reducing gas may have the same duration. That is, the duration of the pulse of the refractory metal-containing precursor may be identical to the duration of the pulse of the reducing gas. For such an embodiment, a time interval ($T_1$) for the pulse of the refractory metal-containing precursor is equal to a time interval ($T_2$) for the pulse of the reducing gas.

Alternatively, the time interval for each of the pulses of the refractory metal-containing precursor and the reducing gas may have different durations. That is, the duration of the pulse of the refractory metal-containing precursor may be shorted or longer than the duration of the pulse of the reducing gas. For such an embodiment, the time interval ($T_1$) for the pulse of the refractory metal-containing precursor is different than the time interval ($T_2$) for the pulse of the reducing gas.

In addition, the periods of non-pulsing between each of the pulses of the refractory metal-containing precursor and the reducing gas may have the same duration. That is, the duration of the period of non-pulsing between each pulse of the refractory metal-containing precursor and each pulse of the reducing gas may be identical. For such an embodiment, a time interval ($T_3$) of non-pulsing between the pulse of the refractory metal-containing precursor and the pulse of the reducing gas is equal to a time interval ($T_4$) of non-pulsing between the pulse of the reducing gas and the pulse of the refractory metal-containing precursor. During the time periods of non-pulsing only the constant carrier gas stream is provided to the process chamber.

Alternatively, the periods of non-pulsing between each of the pulses of the refractory metal-containing precursor and the reducing gas may have different durations. That is, the duration of the period of non-pulsing between each pulse of the refractory metal-containing precursor and each pulse of the reducing gas may be shorter or longer than the duration of the period of non-pulsing between each pulse of the reducing gas and each pulse of the refractory metal-containing precursor. For such, an embodiment, a time interval ($T_3$) of non-pulsing between the pulse of the refractory metal-containing precursor and the pulse of the reducing gas is different from a time interval ($T_4$) of non-pulsing between the pulse of the reducing gas and the pulse of the refractory metal-containing precursor. During the periods of non-pulsing only the constant carrier gas stream is provided to the process chamber.

Additionally, the time intervals for each pulse of the refractory metal-containing precursor, the reducing gas and the periods of non-pulsing therebetween for each deposition cycle may have the same duration. For example, in a first deposition cycle ($C_1$), a time interval ($T_1$) for the pulse of the refractory metal-containing precursor may have the same duration as the time interval ($T_1$) for the pulse of the refractory metal-containing precursor in subsequent deposition cycles ($C_2 \ldots C_N$). Similarly, the duration of each pulse of the reducing gas as well as the periods of non-pulsing between the pulses of the refractory metal-containing precursor and the reducing gas in the first deposition cycle ($C_1$) may have the same duration as each pulse of the reducing gas and the periods of non-pulsing between the pulses of the refractory metal-containing precursor and the reducing gas in subsequent deposition cycles ($C_2 \ldots C_N$), respectively.

Alternatively, the time interval for at least one pulse of the refractory metal-containing precursor, the reducing gas and the periods of non-pulsing therebetween for one or more of the deposition cycles of the barrier layer deposition process may have different durations. For example, in a first deposition cycle ($C_1$), the time interval ($T_1$) for the pulse of the refractory metal-containing precursor may be longer or shorter than the time interval ($T_1$) for the pulse of the refractory metal-containing precursor in subsequent deposition cycles ($C_2 \ldots C_N$). Similarly, the duration of one or more pulse of the reducing gas or the periods of non-pulsing between the pulses of the refractory metal-containing precursor and the reducing gas in deposition cycle ($C_1$) may be longer or shorter than the duration of corresponding pulses of the reducing gas or the periods of non-pulsing between the pulses of the refractory metal-containing precursor and the reducing gas in subsequent deposition cycles ($C_2 \ldots C_N$), respectively.

Referring to step 210, after each deposition cycle (steps 204 through 208), the total number of deposition cycles performed is determined. If a predetermined number of deposition cycles have not been performed, steps 204 through 208 are repeated until such predetermined number of deposition cycles have been completed. However, if a predetermined number of deposition cycles have been completed, the process chamber is purged of both the refractory metal-containing precursor and the reducing gas, as indicated by step 212. The process chamber may be purged using the carrier gas stream. After the process chamber is purged, additional predetermined numbers of deposition cycles (steps 204 through 208) may be performed until a desired thickness for the barrier layer is achieved as indicated by step 214, or ended as indicated by step 216.

For a particular barrier material, the predetermined number of deposition cycles is selected to start depositing barrier material on the dielectric layer within the first few deposition cycles, but is less than the number of deposition cycles needed to start depositing such barrier material on the adjacent metal film. Limiting the number of deposition cycles to a predetermined number that is less than the number needed to start deposition of the barrier material on the adjacent metal film and then purging the process chamber, permits selective deposition of the barrier material only on the dielectric layer.

Figure 4:
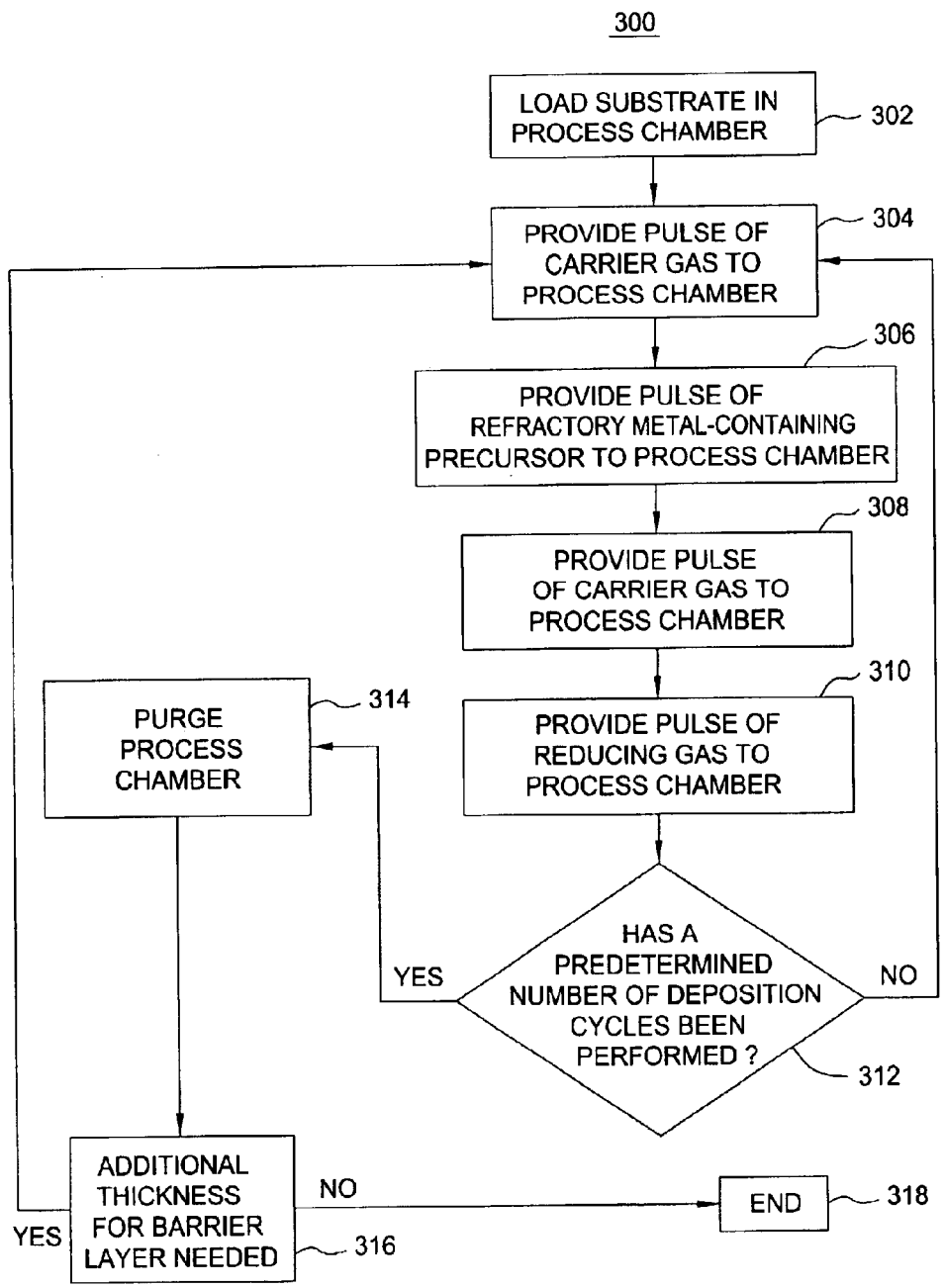
FIG. 4 illustrates a process sequence incorporating selective deposition of a barrier layer on a dielectric material using a cyclical deposition process according to an alternate embodiment described herein.

In an alternate process sequence described with respect to FIG. 4, the barrier layer deposition cycle may comprise separate pulses for each of the refractory metal-containing precursor, the reducing gas and the carrier gas. For such an embodiment, a barrier layer deposition sequence 300 includes introducing a substrate into the process chamber (step 302), providing a pulse of a carrier gas to the process chamber (step 304), providing a pulse of a refractory metal-containing precursor to the process chamber (step 306), providing a pulse of a carrier gas to the process chamber (step 308), providing a pulse of a reducing gas to the process chamber (step 310), and repeating steps 304 through 310 until a predetermined number of deposition cycles are performed (step 312). When a predetermined number of deposition cycles have been completed, the process chamber is purged of both the refractory metal-containing precursor and the reducing gas (step 314). After the process chamber is purged, additional predetermined numbers of deposition cycles (steps 304 through 310) may be performed until a desired thickness for the barrier layer is achieved (step 316), or ended (step 318).

The time intervals for each of the pulses of the refractory metal-containing precursor, the reducing gas and the carrier gas may have the same or different durations as discussed above with respect to FIG. 3. Alternatively, corresponding time intervals for one or more pulses of the refractory metal-containing precursor, the reducing gas and the carrier gas in one or more of the deposition cycles of the barrier layer deposition process may have different durations.

In FIGS. 3–4, the barrier layer deposition cycle is depicted as beginning with a pulse of the refractory metal-containing precursor followed by a pulse of the reducing gas. Alternatively, the barrier layer deposition cycle may start with a pulse of the reducing gas followed by a pulse of the refractory metal-containing precursor. In addition, a pulse may comprise one injection of a gas or several short, sequential injections.

One exemplary deposition cycle for selectively forming a tantalum nitride barrier layer on silicon oxide dielectric material that is adjacent to copper features comprises sequentially providing pulses of pentakis (ethylmethylamido) tantalum (PEMAT) and pulses of ammonia ($NH_3$) to a process chamber similar to that described above with reference to FIG. 2. For such a deposition cycle, argon may be provided to an appropriate flow control valve, for example an electronic flow control valve, at a flow rate of between about 100 sccm (standard cubic centimeters per second) to about 1000 sccm, preferably at about 500 sccm, and thereafter pulsed for about 5 seconds to about 25 seconds, preferably for about 15 seconds. The pentakis(ethylmethylamido) tantalum (PEMAT) may be provided to an appropriate flow control valve, for example an electronic flow control valve, by flowing hydrogen ($H_2$) at a flow rate of between 30 sccm to about 1500 sccm, preferably at about 100 sccm through an ampoule containing liquid PEMAT at a temperature of about 50° C. to about 95° C., and thereafter pulsed for about 5 seconds to about 50 seconds, preferably for about 15 seconds. Argon is then provided at a flow rate of between about 100 sccm to about 1000 sccm, preferably at about 500 sccm, and thereafter pulsed for about 5 seconds to about 25 seconds, preferably for about 15 seconds. The ammonia ($NH_3$) may be provided to an appropriate flow control valve, for example an electronic flow control valve, at a flow rate of between about 150 sccm to about 700 sccm, preferably for about 250 sccm, and thereafter pulsed for about 3 seconds to about 45 seconds, preferably for about 5 seconds. The substrate may be maintained at a temperature between about 150° C. to about 350° C., preferably at about 200° C., at a chamber pressure of up to about 40 torr, preferably at about 0.5 torr.

After a predetermined number of deposition cycles are performed, the process chamber is purged by providing a flow of the carrier gas thereto. Gases such as for example, argon (Ar), helium (He), nitrogen ($N_2$) and hydrogen ($H_2$), among others may be used. The process chamber may be purged by providing a flow of gas at about 100 sccm to about 1000 sccm, preferably at about 500 sccm, for a duration of up to about 2 minutes, preferably for about 1 minute.

Figure 5A:
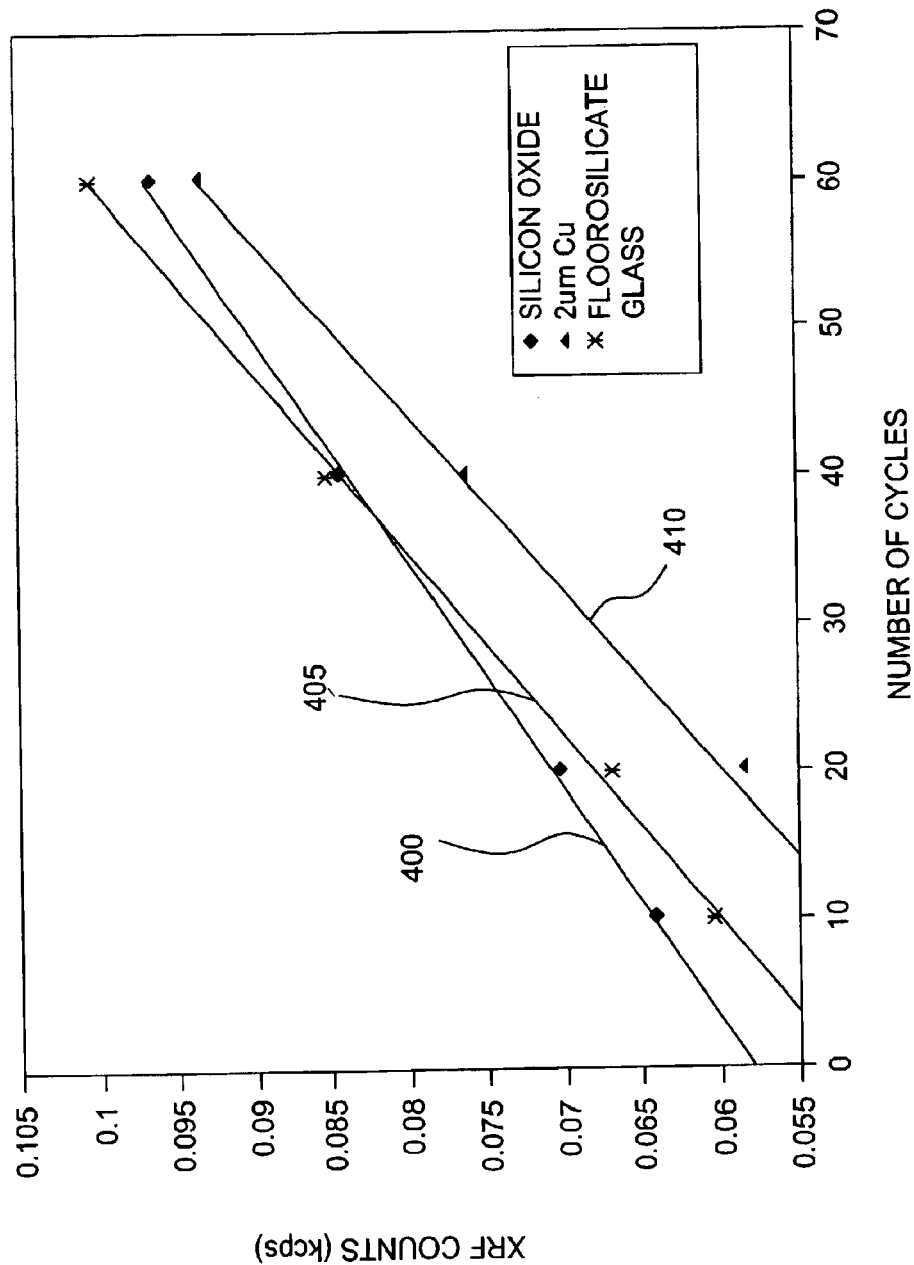
FIG. 5A is a graph showing the number of deposition cycles needed to start forming a tantalum nitride layer on dielectric material as compared to the number of deposition cycles needed to start forming a tantalum nitride layer on copper.

FIG. 5A is a plot illustrating the number of deposition cycles needed to start forming a tantalum nitride layer on dielectric oxides as compared to the number of deposition cycles needed to start forming a tantalum nitride layer on copper. Each deposition cycle was performed at a substrate temperature of about 225° C., a deposition chamber pressure of about 0.5 torr, a pentakis(ethylmethylamido) tantalum flow of about 100 sccm with hydrogen ($H_2$) that is pulsed for about 15 seconds, an ammonia ($NH_3$) flow of 250 sccm that is pulsed for about 5 seconds and an argon (Ar) flow of about 500 sccm that is pulsed for about 15 seconds between each pulse of the pentakis(ethylmethylamido) tantalum (PEMAT) and each pulse of the ammonia ($NH_3$).

Referring to FIG. 5A, the tantalum nitride (TaN) starts to deposit on the silicon oxide during a first deposition cycle, as indicated by line 400. The tantalum nitride (TaN) starts to deposit on the fluorosilicate glass (FSG) during a fifth deposition cycle, as indicated by line 405. However, the tantalum nitride starts to deposit on the copper during the fourteenth deposition cycle, as indicated by line 410. As such, for the process conditions recited above with respect to FIG. 5A, selective deposition of tantalum nitride (TaN) on either silicon oxide or fluorosilicate glass (FSG) without deposition on the copper, necessitates that the process chamber be purged each time thirteen deposition cycles have been completed.

The number of deposition cycles needed to start forming a tantalum nitride (TaN) layer on material layers may vary as a function of the substrate temperature. For example, a tantalum nitride (TaN) layer was formed on both silicon oxide and copper at a substrate temperature of 200° C. Each deposition cycle was performed at a deposition chamber pressure of about 0.5 torr, a pentakis(ethylmethylamido) tantalum flow of about 100 sccm with hydrogen ($H_2$) that is pulsed for about 15 seconds, an ammonia ($NH_3$) flow of 250 sccm that is pulsed for about 5 seconds and an argon (Ar) flow of about 500 sccm that is pulsed for about 15 seconds between each pulse of the pentakis(ethylmethylamido) tantalum (PEMAT) and each pulse of the ammonia ($NH_3$).

Figure 5B:
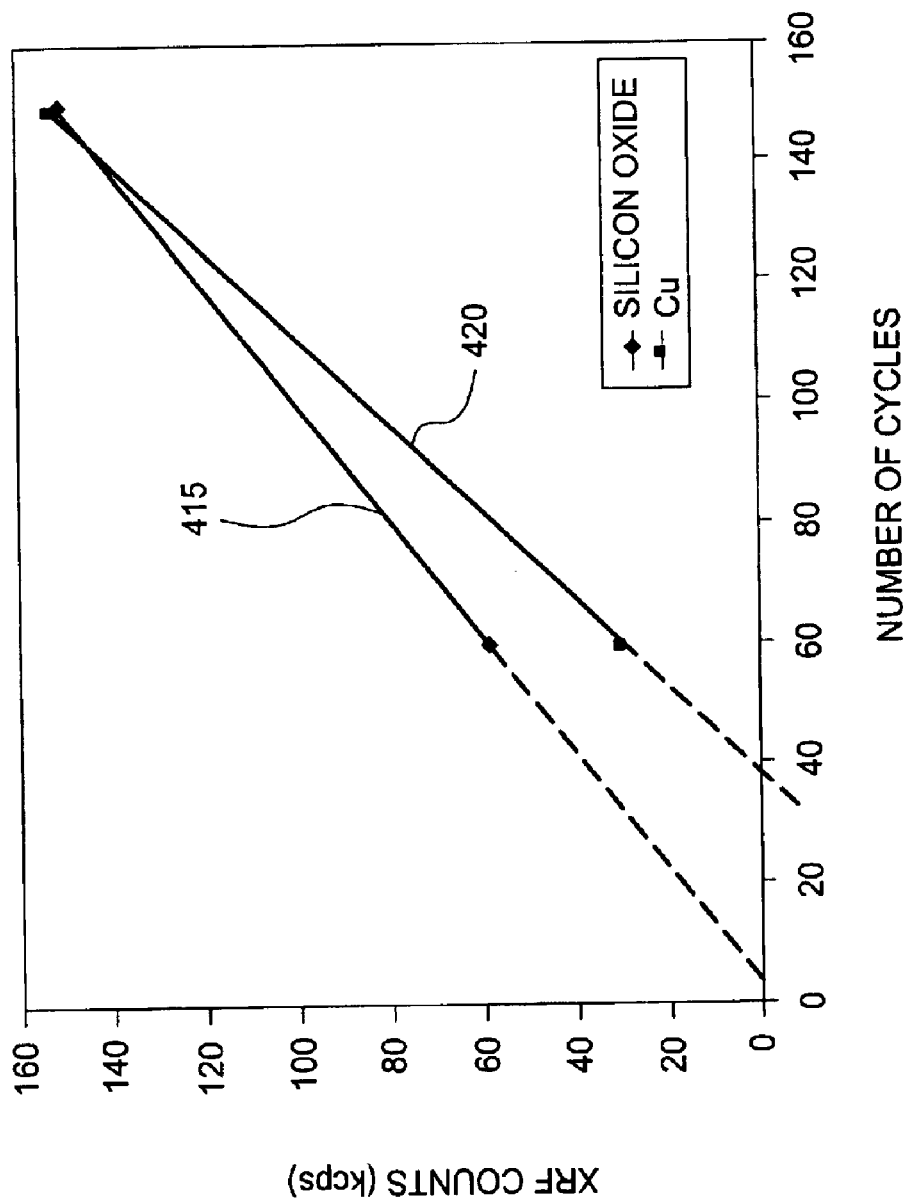
FIG. 5B is a graph showing the number of deposition cycles needed to start forming a tantalum nitride layer on both silicon oxide and copper at a temperature of about 200° C.

Referring to FIG. 5B, about five deposition cycles were needed to start forming a tantalum nitride (TaN) layer on silicon oxide at a substrate temperature of about 200° C., as indicated by line 415, as compared to one deposition cycle when the substrate temperature is about 225° C., as indicated by line 400 (FIG. 5A). In contrast, about forty deposition cycles were needed to start forming a tantalum nitride (TaN) layer on copper at a substrate temperature of about 200° C., as indicated by line 420, as compared to fourteen deposition cycles when the substrate temperature is about 225° C., as indicated by line 410 (FIG. 5A).

The number of deposition cycles needed to start forming a tantalum nitride (TaN) layer on silicon oxide may vary as a function of the process chamber pressure. For example, a tantalum nitride (TaN) layer was formed on silicon oxide at a process chamber pressures of 0.5 torr, 1 torr, 2 torr and 6 torr. Each deposition cycle was performed at a substrate temperature of about 210° C., a pentakis(ethylmethylamido) tantalum flow of about 100 sccm with hydrogen ($H_2$) that is pulsed for about 15 seconds, an ammonia ($NH_3$) flow of 250 sccm that is pulsed for about 5 seconds and an argon (Ar) flow of about 500 sccm that is pulsed for about 15 seconds between each pulse of the pentakis(ethylmethylamido) tantalum (PEMAT) and each pulse of the ammonia ($NH_3$).

Figure 5C:
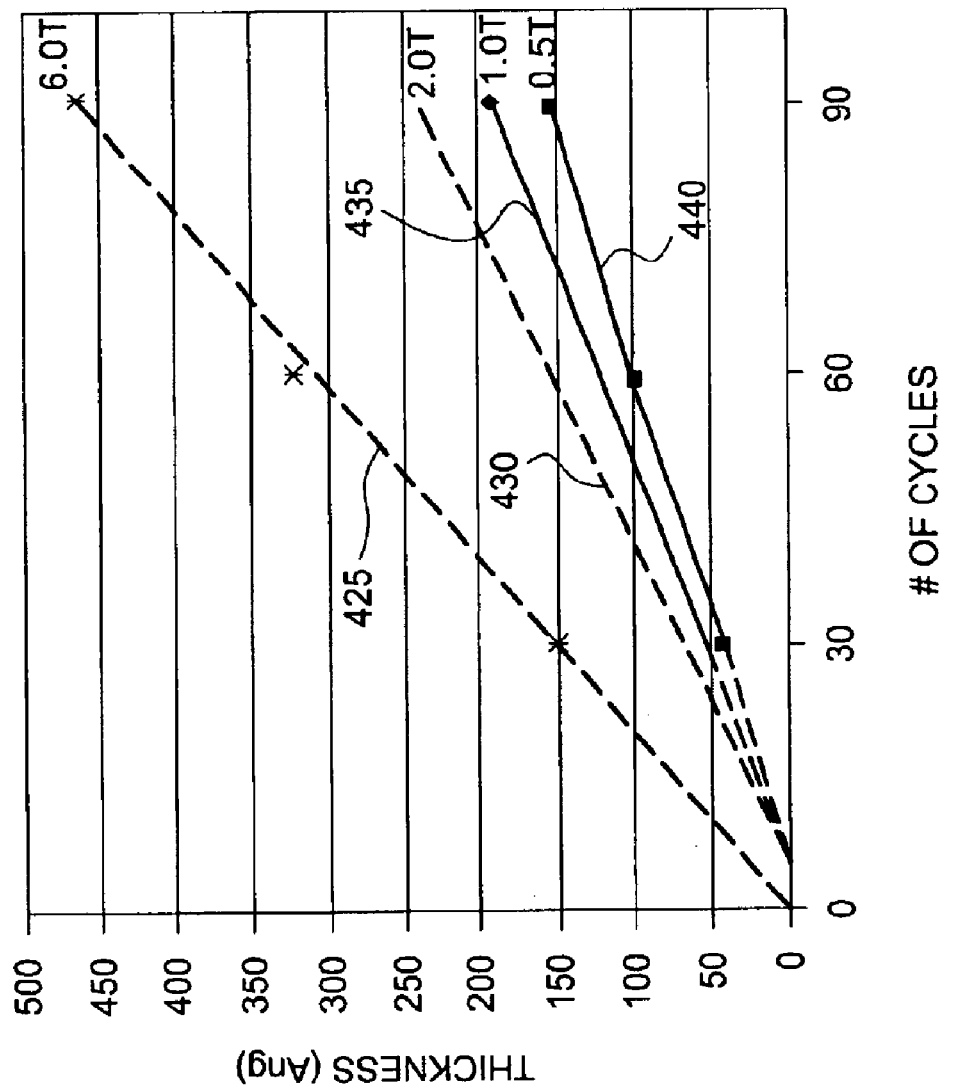
FIG. 5C is a graph showing the number of deposition cycles needed to start forming a tantalum nitride layer on silicon oxide as a function of the process chamber pressure.

Referring to FIG. 5C, about eight deposition cycles were needed to start forming a tantalum nitride (TaN) layer on silicon oxide at process chamber pressures of 0.5 torr, 1 torr and 2 torr, as indicated by line 440, line 435 and line 430, respectively. In contrast, about two deposition cycles were needed to start forming a tantalum nitride (TaN) layer on silicon oxide at a process chamber pressure of 6 torr, as indicated by line 425.

Integrated Circuit Fabrication Process

Figure 6A:
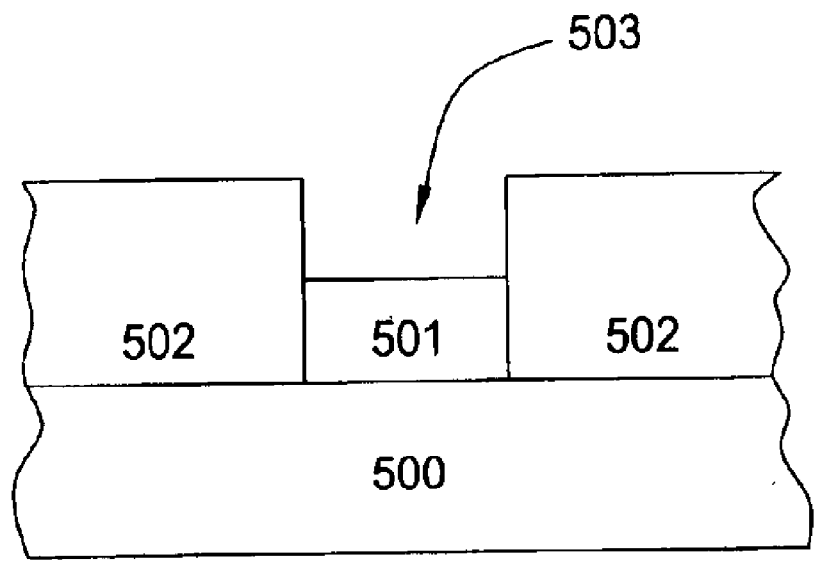
FIGS. 6A–6C depict cross-sectional views of a substrate at different stages of an interconnect fabrication process.
Figure 6B:
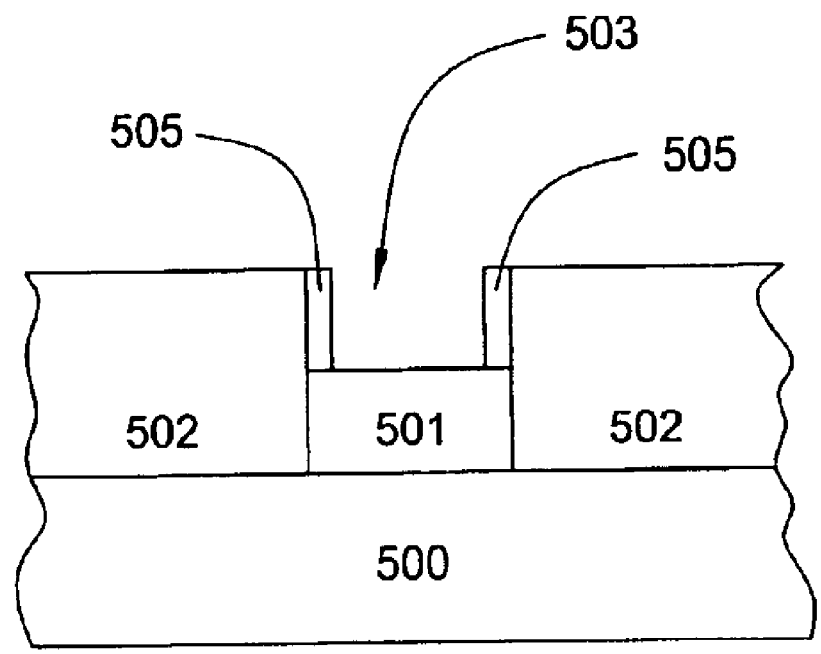
Figure 6C:
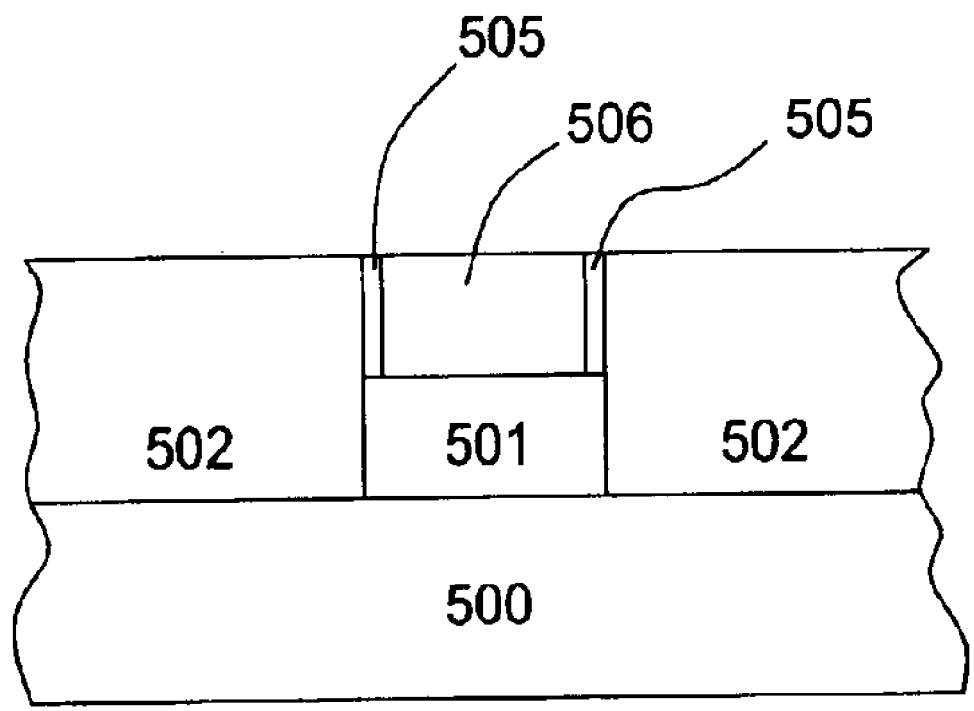

FIGS. 6A–6C illustrate schematic cross-sectional views of a substrate 500 at different stages of an integrated circuit fabrication sequence incorporating a tantalum nitride barrier layer formed on dielectric material. Depending on the specific stage of processing, substrate 500 may correspond to a silicon substrate, or other material layer that has been formed on the substrate 500. FIG. 6A, for example, illustrates a cross-sectional view of a substrate 500 having conductive leads 501 formed thereon surrounded by a dielectric material 502. The conductive leads 501 may be metal (e.g., aluminum (Al) or copper (Cu)). The dielectric material 502 may be an oxide (e.g., silicon oxide).

FIG. 6A illustrates one embodiment in which the substrate 500 is silicon having copper leads 501 formed thereon. The copper leads 501 have a thickness of about 5,000 Å to about 2 microns depending on the size of the structure to be fabricated. A dielectric material 502 surrounds the copper leads 501. The dielectric material 502 may be a low dielectric constant silicon oxide layer. The dielectric material 502 may have a thickness of up to about 5 microns.

Vias 503 are defined in the dielectric material 502 to the copper leads 501. The vias are defined in the dielectric material 502 using conventional lithography and etching techniques.

Referring to FIG. 6B, a tantalum nitride barrier layer 505 is selectively formed on the dielectric material 502 comprising the sidewalls of the vias 503. The tantalum nitride barrier layer 505 may be formed according to the process parameters described above with respect to FIGS. 3–4. The thickness of the tantalum nitride barrier layer 505 should be about 50 Å to about 500 Å.

Thereafter, referring to FIG. 6C, the vias 503 are filled with a conductive material 506 such as aluminum (Al), copper (Cu), tungsten (W), or combinations thereof. Preferably, copper (Cu) is used to fill the vias 503 due to its low resistivity (resistivity of about 1.7 $\mu\Omega$/cm). The conductive material 506 may be deposited using chemical vapor deposition (CVD) techniques, physical vapor deposition techniques (PVD) techniques, electroplating techniques, or combinations thereof.

Formation of the tantalum nitride barrier layer 505 on the dielectric material 502 comprising the sidewalls of the vias 503 advantageously prevents metal migration into such dielectric material when the vias 503 are subsequently filled with the conductive material 506. In addition, selective deposition of the barrier layer 505 only on the sidewalls of the vias 503 minimizes any increase to the overall resistivity of the interconnect structure which would otherwise occur had the barrier material 505 also been deposited on the copper leads 501.

While the foregoing is directed to the preferred embodiment of the present invention, other and further embodiments of the invention may be devised without departing from the basic scope thereof, and the scope thereof is determined by the claims that follow.

What is claimed is:

1. A method of selectively forming a barrier layer on a dielectric material, comprising:

providing a substrate having exposed metal features surrounded by a dielectric material to a process environment;

forming a barrier layer on the dielectric material using a cyclical deposition process, wherein the cyclical deposition process includes a predetermined number of deposition cycles followed by a purge step, and wherein the predetermined number of deposition cycles is less than a number of deposition cycles needed to start forming the barrier layer on the exposed metal features; and repeating the cyclical deposition process until a desired thickness for the barrier layer is formed.

2. The method of claim 1 wherein each deposition cycle comprises alternately providing a refractory metal-containing precursor and a reducing gas to the process environment.

3. The method of claim 2 wherein the refractory metal-containing precursor is a tantalum-containing precursor.

4. The method of claim 3 wherein the tantalum-containing precursor is selected from the group consisting of pentakis (dimethylamido) tantalum (PDMAT), pentakis (diethylamido) tantalum (PDEAT), pentakis (ethylmethylamido) tantalum (PEMAT), t-butylamino tris (methylethylamido) tantalum (TBTMET), t-butylamino tris (dimethylamido) tantalum (TBTDMT), bis (cyclopentadienyl) tantalum trihydride, bis (methylcyclopentadienyl) tantalum trihydride and t-butylamino tris(diethylamido) tantalum (TBTDET).

5. The method of claim 4 wherein the tantalum-containing precursor is pentakis(ethylmethylamido) tantalum (PEMAT).

6. The method of claim 3 wherein the tantalum-containing precursor is provided by flowing a carrier gas at about 30 sccm (standard cubic centimeters per minute) to about 1500 sccm through an ampoule having the tantalum-containing precursor therein.

7. The method of claim 6 wherein the tantalum-containing precursor is provided by flowing a carrier gas at about 100 sccm through an ampoule having the tantalum-containing precursor therein.

8. The method of claim 3 wherein the tantalum-containing precursor is provided for a duration of about 5 seconds to about 50 seconds.

9. The method of claim 8 wherein the tantalum-containing precursor is provided for a duration of about 15 seconds.

10. The method of claim 2 wherein the reducing gas is selected from the group consisting of ammonia ($NH_3$), hydrazine ($N_2H_4$), methyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azoisobutane ($(CH_3)_6C_2N_2$) and ethylazide ($C_2H_5N_3$).

11. The method of claim 10 wherein the reducing gas is ammonia ($NH^3$).

12. The method of claim 2 wherein the reducing gas is provided at about 150 sccm (standard cubic centimeters per minute) to about 700 sccm.

13. The method of claim 12 wherein the reducing gas is provided at about 250 sccm.

14. The method of claim 2 wherein the reducing gas is provided for a duration of about 3 seconds to about 45 seconds.

15. The method of claim 14 wherein the reducing gas is provided for a duration of about 5 seconds.

16. The method of claim 1 wherein the purge step comprises providing a purge gas to the process environment.

17. The method of claim 16 wherein the purge gas is selected from the group consisting of helium (He), argon (Ar), nitrogen ($N_2$), hydrogen ($H_2$), and combinations thereof.

18. The method of claim 16 wherein the purge gas is provided at about 100 sccm to about 1000 sccm.

19. The method of claim 1 wherein the process environment comprises a temperature of about 150° C. to about 350° C.

20. The method of claim 19 wherein the process environment comprises a temperature of about 200° C.

21. The method of claim 1 wherein the process environment comprises a pressure of up to about 100 torr.

22. The method of claim 21 wherein the process environment comprises a pressure of about 0.5 torr.

23. A method of selectively forming a tantalum nitride barrier layer on a dielectric material, comprising:

providing a substrate having exposed metal features surrounded by a dielectric material to a process environment;

forming a tantalum nitride barrier layer on the dielectric material using a cyclical deposition process, wherein the cyclical deposition process includes a predetermined number of deposition cycles followed by a purge step, and wherein the predetermined number of deposition cycles is less than a number of deposition cycles needed to start forming the tantalum nitride barrier layer on the exposed metal features; and repeating the cyclical deposition process until a desired thickness for the tantalum nitride barrier layer is formed.

24. The method of claim 23 wherein each deposition cycle comprises alternately providing a tantalum-containing precursor and a reducing gas to the process environment.

25. The method of claim 24 wherein the tantalum-containing precursor is selected from the group consisting of pentakis(dimethylamido) tantalum (PDMAT), pentakis (diethylamido) tantalum (PDEAT), pentakis (ethylmethylamido) tantalum (PEMAT), t-butylamino tris (methylethylamido) tantalum (TBTMET), t-butylamino tris (dimethylamido) tantalum (TBTDMT), bis (cyclopentadienyl) tantalum trihydride, bis (methylcyclopentadienyl) tantalum trihydride and t-butylamino tris(diethylamido) tantalum (TBTDET).

26. The method of claim 25 wherein the tantalum-containing precursor is pentakis(ethylmethylamido) tantalum (PEMAT).

27. The method of claim 24 wherein the tantalum-containing precursor is provided by flowing a carrier gas at about 30 sccm (standard cubic centimeters per minute) to about 1500 sccm through an ampoule having the tantalum-containing precursor therein.

28. The method of claim 27 wherein the tantalum-containing precursor is provided by flowing a carrier gas at about 100 sccm through an ampoule having the tantalum-containing precursor therein.

29. The method of claim 24 wherein the tantalum-containing precursor is provided for a duration of about 5 seconds to about 50 seconds.

30. The method of claim 29 wherein the tantalum-containing precursor is provided for a duration of about 15 seconds.

31. The method of claim 24 wherein the reducing gas is selected from the group consisting of ammonia ($NH_3$), hydrazine ($N_2H_4$), methyl hydrazine ($CH_3N_2H_3$), dimethyl hydrazine ($C_2H_6N_2H_2$), t-butyl hydrazine ($C_4H_9N_2H_3$), phenyl hydrazine ($C_6H_5N_2H_3$), 2,2'-azoisobutane ($(CH_3)_6C_2N_2$) and ethylazide ($C_2H_5N_3$).

32. The method of claim 31 wherein the reducing gas is ammonia ($NH_3$).

33. The method of claim 24 wherein the reducing gas is provided at about 150 sccm (standard cubic centimeters per minute) to about 700 sccm.

34. The method of claim 33 wherein the reducing gas is provided at about 250 sccm.

35. The method of claim 24 wherein the reducing gas is provided for a duration of about 3 seconds to about 45 seconds.

36. The method of claim 35 wherein the reducing gas is provided for a duration of about 5 seconds.

37. The method of claim 23 wherein the purge step comprises providing a purge gas to the process environment.

38. The method of claim 37 wherein the purge gas is selected from the group consisting of helium (He), argon (Ar), nitrogen ($N_2$), hydrogen ($H_2$), and combinations thereof.

39. The method of claim 37 wherein the purge gas is provided at about 100 sccm to about 1000 sccm.

40. The method of claim 23 wherein the process environment comprises a temperature of about 150° C. to about 350° C.

41. The method of claim 40 wherein the process environment comprises a temperature of about 200° C.

42. The method of claim 23 wherein the process environment comprises a pressure of up to about 100 torr.

43. The method of claim 42 wherein the process environment comprises a pressure of about 0.5 torr.

* * * * *

UNITED STATES PATENT AND TRADEMARK OFFICE
CERTIFICATE OF CORRECTION

PATENT NO. : 6,939,801 B2  
DATED : September 6, 2005  
INVENTOR(S) : Chung et al.

Page 1 of 1

It is certified that error appears in the above-identified patent and that said Letters Patent is hereby corrected as shown below:

Title page,  
Item [56], References Cited, U.S. PATENT DOCUMENTS, "2002/0146511 A1" reference, after "et al" insert -- . --.

Drawings,  
Sheet 5 of 9, FIG. 5A, Box. 1, line 3, delete "FLOOROSILICATE" and insert -- FLUOROSILICATE --.

Column 1,  
Line 56, delete "tantalum.nitride" and insert -- tantalum nitride --.

Column 3,  
Line 33, delete "EMBODIMENT" and insert -- EMBODIMENTS --.

Column 6,  
Line 27, delete "shorted" and insert -- shorter --.

Column 7,  
Line 22, delete "($C_1$)" and insert -- ($C_1$) --.

Column 11,  
Line 46, delete "($NH^3$)" and insert -- ($NH_3$) --.

Signed and Sealed this

Ninth Day of May, 2006

JON W. DUDAS  
*Director of the United States Patent and Trademark Office*